US008247038B2

(12) United States Patent
Bousseksou et al.

(10) Patent No.: US 8,247,038 B2
(45) Date of Patent: Aug. 21, 2012

(54) PROCESS FOR THE APPLICATION OF SPIN TRANSITION MOLECULAR MATERIALS IN THIN LAYERS

(75) Inventors: Azzedine Bousseksou, Toulouse (FR); Gabor Molnar, Toulouse (FR); Saioa Cobo, Castanet Tolosan (FR); Lionel Salmon, Carcassonne (FR); José Antonio Real Cabezos, Valencia (ES); Christophe Vieu, Auzeville Tolosane (FR)

(73) Assignees: Centre National de la Recherche Scientifique (C.N.R.S), Paris (FR), part interest; Universitat de Valencia, Valencia (ES), part interest ( * ) Notice: Subject to any disclaimer, the term of this patent is extended or adjusted under 35 U.S.C. 154(b) by 779 days.

(21) Appl. No.: 12/294,090

(22) PCT Filed: Feb. 19, 2007

(86) PCT No.: PCT/FR2007/000297
§ 371 (c)(1),
(2), (4) Date: Mar. 27, 2009

(87) PCT Pub. No.: WO2007/107644
PCT Pub. Date: Sep. 27, 2007

(65) Prior Publication Data
US 2009/0291328 A1 Nov. 26, 2009

(30) Foreign Application Priority Data
Mar. 23, 2006 (FR) ..................................... 0602539

(51) Int. Cl.
*B05D 5/00* (2006.01)
(52) U.S. Cl. .............. 427/402; 427/255.11; 427/255.14; 427/255.23; 427/255.394; 427/259; 427/261; 427/270; 427/271; 427/272; 427/282; 427/294; 427/295; 427/372.2; 427/384; 427/407.1; 427/419.1; 427/430.1; 427/443.2

(58) Field of Classification Search ............. 427/255.11, 427/255.14, 255.23, 255.394, 259, 261, 270, 427/271, 272, 282, 294, 295, 372.2, 384, 427/402, 407.1, 419.1, 430.1, 443.2
See application file for complete search history.

(56) References Cited

U.S. PATENT DOCUMENTS
6,055,180 A * 4/2000 Gudesen et al. .............. 365/175
2003/0230746 A1* 12/2003 Stasiak ........................... 257/40

FOREIGN PATENT DOCUMENTS
WO WO 2004/073079 A1 * 8/2004
WO WO 2006/050052 A2 * 5/2006

OTHER PUBLICATIONS

Kawakami et al. "Electrical Bistable Devices Using Organic Materials." Fuji Electric Review. 50.3 72-76.*
Nakaya et al., "Electrooptic Bistability of a Ferroelectric Liquid Crystal Device Prepared Using Charge-Transfer Complex-Doped Polyimide-Orientation Films," Japanese Journal of Applied Physics, vol. 28, No. 1, Jan. 1989, pp. L116-L118.*
Majumdar et al., "Conductance switching and data-storage in oriented polymer-based devices: impedance characteristics," Thin Solid Films 446 (2004) 296-300.*
Search Report for FR 2 898 910 A1, published Sep. 28, 2007, 2 pages.*
Rapport Preliminaire International Sur La Brevetabilite PCT/FR2007/000297, Dec. 3, 2008, 2 pgs.*

* cited by examiner

*Primary Examiner* — William Phillip Fletcher, III
(74) *Attorney, Agent, or Firm* — Young & Thompson

(57) ABSTRACT

This application relates to a process for the application of thin layers of substantially pure spin transition molecular materials while maintaining the hysteresis properties of the material. The process makes it possible to obtain a dense uniform surface with very low roughness.

17 Claims, 7 Drawing Sheets

PROCESS FOR THE APPLICATION OF SPIN TRANSITION MOLECULAR MATERIALS IN THIN LAYERS

CROSS-REFERENCE TO RELATED APPLICATIONS

The instant application claims benefit of priority to PCT/FR2007/000297 filed Feb. 19, 2007 and French Application 06/02539 filed Mar. 26, 2006.

STATEMENT REGARDING FEDERALLY SPONSORED RESEARCH OR DEVELOPMENT

None.

THE NAMES OF THE PARTIES TO A JOINT RESEARCH AGREEMENT

None.

INCORPORATION-BY-REFERENCE OF MATERIAL SUBMITTED ON A COMPACT DISC

None.

BACKGROUND OF THE INVENTION (1) Field of the Invention

Molecular complexes showing spin transition phenomena have been the subject of fundamental research since their discovery in 1931. Since then approximately three hundred complexes have been synthesised and studied using different physical-chemical techniques. The spin transition phenomenon can be initiated by temperature, pressure (G. Molnar et al., J. Phys., B. 107, 2003, p. 3149; A. Bousseksou et al., C. R. Chimie 6, 2003, p. 329), an intense magnetic field (Bousseksou et al., Top. Curr. Chem. 235, 2004, p. 65) or light (N. Ould Moussa et al., Phys. Rev. Lett., 94 2005, p. 107205; S. Bonhommeau et al., Angew. Chem. Int., Ed. 44, 2005, p. 2) and is accompanied by a change in magnetic, optical and/or electrical properties. This phenomenon has been physically modelled and is well understood (A. Bousseksou et al., Eur. J. Inorg. Chem., 2004, p. 4353). From the point of view of applications a number of interesting prospects have been suggested (O. Kahn et al., Science 279, 1998, p. 44; O. Kahn et al., Chem. Mater. 9, 1997, p. 3199; O. Kahn et al., Adv. Mater. 4, 1992, p. 718). In particular thermal hysteresis of the dielectric constant in the course of spin transition has been discovered (FR 0111328, EP1430552, A. Bousseksou et al., J. Mater. Chem. 13, 2003, p. 2069), thus making it possible to design micro-nano-condensers having the property of storing information on the molecular aggregate scale.

(2) Description of Related Art

Using the physical properties of inorganic and organometallic complexes generally requires placing these compounds as a thin layer on a substrate and, if necessary, micro- or nano-structuring into elements of submicron size. The difficulty in this lies in compatibility between the product and the process of deposition, because spin transition is a phenomenon which is very sensitive to various disturbances of the crystal lattice.

So far two methods of deposition have been suggested:
the method known as the Langmuir Blodgett method, which consists of preparing a film by transferring a single layer floating on a liquid onto a solid support. This method can however only produce a two-dimensional monolayer; this is inadequate for most applications because (1) it is difficult to detect hysteresis cycles in a monolayer (particularly in the case of a deposit on a small surface area) and (2) maintenance of the hysteresis cycle is not ensured in the case of a single monolayer.

The method known as "spin coating", which consists of depositing a fluid on a support by centrifuging (spinning plate), followed if appropriate by evaporation of the solvent. However the spin transition material is deposited in the form of a mixture with an inactive matrix, generally a polymer. Mixing of the active material with the matrix may be discontinuous and generally gives rise to a non-homogeneous deposit. In addition to this, dissolution of the material in the matrix causes loss of the crystalline lattice. These disadvantages therefore limit the use of this process.

There is therefore at the present time no method through which a thin layer of spin transition complexes can be deposited as a thin layer while maintaining the properties of spin transition, hysteresis and a surface condition of acceptable quality. It is therefore particularly desirable to provide a process for the deposition of spin transition complexes as thin layers which will fulfil these requirements.

BRIEF SUMMARY OF THE INVENTION

The present inventors have discovered a process of thin layer application which fulfils these requirements. In particular the process according to the invention makes it possible to maintain properties such as the hysteresis, transition temperature, etc., of the massive material when it is deposited as a thin layer. In addition to this the thin layer comprises only the spin transition compound, so it is not necessary to use a mixture, as is the case in spin coating, where a binding polymer/material mixture is required.

The process according to the invention also makes it possible to control the thickness of the deposited layers over a very wide range—from a few nanometers to a few micrometers. Furthermore the thin layers obtained are dense, uniform, of very small roughness, generally between 1 and 20 nm. Finally, micro- and nano-structuring of the deposits is possible; the process according to the invention makes it possible to produce perfectly localised deposits.

The present inventors have therefore prepared a bistable thin layer comprising a substantially pure spin transition material for the first time. This layer can of course be subsequently micro/nano-structured. The said layers are one object of this invention.

According to a first object, this invention therefore relates to a process for the thin layer deposition of a spin transition material on a substrate, characterised in that the said process comprises the step of applying a bistable thin layer of the said substantially pure material.

The process is particularly advantageous in that the spin transition and hysteresis properties of the said material are preserved.

By spin transition material is meant any material in which the spin transition phenomenon takes place, which is bistable and which preferably shows hysteresis at ambient temperature.

By "thin layer" deposition is meant the application onto the said substrate of a layer of material whose thickness lies between 1 nm and 10 micrometers.

By substrate is meant any type of substrate normally used as a support for the deposition of materials. The type of substrate may depend on the envisaged application or the material being deposited. The substrate may or may not be metallised, conducting or insulating, crystalline or amorphous. Preferably the substrate comprises an inert material, that is to say one which does not engage in interactions with the desired properties of the spin transition material. In particular the substrate may comprise Si or $SiO_2$, which may optionally be coated with one or more layers of metal, such as titanium or gold. Choice of substrate forms part of the routine knowledge and skills of those skilled in the art.

Furthermore, the substrate may be micro- or nano-structured, using conventional techniques. Micro- or nano-structures of thin layers of spin transition compounds may be manufactured using a microtechnology technique known as "lift-off". One important condition for the use of this process is that the thin layer should be insoluble in the solvent used to lift the resin (for example acetone). This condition is fulfilled by three-dimensional systems, in particular those described below, which are very poorly soluble in common solvents. In the case of deposits made using the layer-by-layer technique an additional condition must be fulfilled—the resin used to mask the surface must be insoluble in the solvent used for deposition. This problem does not arise in the case of the process of deposition by evaporation.

In order to manufacture micro/nano-structured molecular deposits the substrate is first coated with a photosensitive resin and then different resin patterns are obtained by standard photolithography or electronic lithography. The spin transition compound is then deposited layer-by-layer or by thermal evaporation. In the last (lift-off) step the patterns of resin (negative image) are dissolved in acetone, leaving patterns comprising the molecular complex (positive image) which are insoluble in acetone on the substrate.

This method makes it possible to deposit the compound as small elements of controlled size (of micron and nanometer dimensions) having a very favourable morphology (dense with little roughness) for various envisaged applications using spin transition molecular compounds.

By substantially pure spin transition material is meant the said material alone, in particular excluding any matrix, especially a polymer matrix.

Spin transition and hysteresis properties are preserved in the material deposited as a thin layer, that is to say they are similar to those of the material in the massive state.

According to a first aspect this invention relates to a process for the thin layer deposition of a spin transition material according to the layer-by-layer technique.

The said process comprises:
1. application of a binding monolayer,
2. application of one or more layers of the said material by successive immersion of the said substrate coated with the binding monolayer in each of the solutions S(i) containing constituent (i) respectively of the said material, and
3. stoving/solvent evaporation.

This process is based on successive assembly of the constituents (i) of the spin transition material.

In general, the spin transition material is in the form of a three-dimensional lattice.

Preferably, the spin transition material is an inorganic-metallic or organometallic coordination complex.

According to another preferred aspect, the spin transition material is an ionic system.

According to another preferred aspect, the spin transition material is a metal complex based on azopyridine, in particular those of formula $M(4-4'-azopyridine)M'(CN)_4$, or $M(pyrazine)[M'(CN)_4]$, where M and M' are the same or different transition metals.

According to another preferred aspect, the spin transition material is an analogue of Prussian blue, of formula $AM[M'(CN)_6]$, in which A is an element in group IA and M and M' are the same or different transition metals.

Again more preferably, the said material may be selected from $Fe(pyrazine)[Pt(CN)_4]$, $Fe(pyrazine)Ni(CN)_4$, $Fe(pyrazine)[Pd(CN)_4]$, $Fe(4-4'-azopyridine) Pd(CN)_4$, $Fe(4-4'-azopyridine)Ni(CN)_4$, $Fe(4-4'-azopyridine)Pt(CN)_4$, $NaCo[Fe(CN)_6]$, $RbMn[Fe(CN)_6]$, or also $[Fe(NH_2trz)_3](NO_3)_2$, $[Fe(Htrz)_2(trz)](NO_3)_2$, $[Fe(NH_2trz)_3](Br)_2$, $[Fe(Htrz)_{3-3x}(NH_2trz)_{3x}](ClO_4) \cdot H_2O$, $[Fe(NH_2trz)_3](NO_3)_{1.7}(BF_4)_{0.4}$.

In general, the motive force for assembly of the material is the exothermic formation of covalent bonds between the metal and the ligands or electrostatic attraction between the cations and the anions. Deposition rates are generally between one hour and ten hours per 100 nm thickness.

The layer-by-layer process according to the invention comprises a preliminary step comprising rendering the support functional through the application of a binding layer, preferably a monolayer, based on a material having groups which will enable the said spin transition material to be anchored to the said substrate. Preferably the binding material comprises thiol, silane groups, dendrimer structures or 4,4'-azopyridine residues. More preferably the monolayer comprises cystamine or 4-mercaptopyridine or 4,4'-azopyridine. Generally the monolayer is applied by immersing the said substrate in a solution of the material. Preferably the said solution is an alcoholic solution, in for example ethanol, in a concentration between 1 and 20 mM, more preferably between 1 and 10 mM.

In general step 2 of the process according to the invention comprises a step of rinsing between each immersion in each solution S(i).

Solutions S(i) contain respectively the said constituent (i), which may be coordinated, in alcohol solution, using for example ethanol, at concentrations of between 10 and 500 mM, and preferably between 50 mM and 100 mM.

In general step 2 is performed at a temperature of between −80° C. and 30° C., preferably at around −60° C.

Step 2 may be repeated as many times (n) as necessary in order to obtain (n) desired layers and/or the desired thickness.

On completion of the immersion and, if appropriate, the rinsing steps, the process comprises a stoving step to remove traces of solvent. This step is generally performed at a temperature of between 100° and 200° C. for such time as is necessary for satisfactory removal of the solvent. In general heating times are of between a few minutes and a few hours.

The presence of the binding layer, identified by chemical analysis, for example using a SIMS, is characteristic of the process according to the invention.

According to a second aspect, this invention relates to a process for the thin layer deposition of a spin transition material characterised in that the said process comprises the step of thermal sublimation of the said material under vacuum.

In general the sublimation step is carried out at a pressure of between $10^{-5}$-$10^{-6}$ Torr, at a temperature of between 100 and 300° C.

In the context of this aspect of the process the said spin transition material is sublimable. Preferably the said spin transition material is a metal complex such as $Fe[tris(1-pyrazolyl)borate]_2$.

This method is not limited to either substrate or form.

The thermal evaporation process has the advantage that deposition is carried out under very low vacuum (typically $10^{-5}$-$10^{-6}$ Torr); the product is therefore very pure without contamination. As a consequence, a chemical analysis, for example using secondary ion mass spectrometry, can be used to check that impurities (solvent, etc.) are absent from within the deposit, a feature of the process by thermal evaporation according to the invention.

According to a preferred aspect, the spin transition material is first purified by sublimation, for example using a chemical sublimator.

For applications in microelectronics the substance may be first micro- or nano-structured prior to deposition. This is particularly advantageous because in this way the subsequent procedures of structuring the material once it has been deposited are no longer necessary.

The process according to the invention may be used extensively for the manufacture of any electrical, electronic, optical or photographic component in which it is necessary to obtain a deposit of spin transition material which retains its hysteresis properties.

This invention also relates to any bistable thin layer comprising a substantially pure spin transition material capable of being obtained by the process according to this invention.

According to another object, this invention also relates to a component comprising a substrate on which a single layer of spin transition material is deposited, characterised in that the thin layer is capable of being obtained by the process according to the invention. Mention may in particular be made of a component comprising electrodes between which a spin transition material is applied using the process according to the invention, such as for example a molecular memory comprising a condenser comprising armatures between which a spin transition material is applied using the process according to the invention. One example of such molecular memories is described in WO 03/019695. Mention may also be made of photochromic, thermochromic, electrochromic or piezochromic components comprising a substrate, for example glass, to which a spin transmission material is applied by the process according to the invention.

According to another object this invention also relates to a process for the micro/nano-structuring of thin layer spin transition material comprising:
  i. application of a photosensitive resin or an electronic lithography resin to a substrate,
  ii. obtaining the desired patterns in the resin,
  iii. applying a single layer spin transition material by the process according to the invention, and
  iv. lift-off of the resin.

The resin may be selected from any resin commonly used for the lift-off technique. This resin must be insoluble in the solvent used when depositing the material. Furthermore the thin layer must be insoluble in the solvent used to lift the resin. By way of resins mention may in particular be made of PMMA (polymethylmethacrylate) or AZ5214E. An appropriate solvent for lift-off is in particular trichloroethylene or acetone, which can dissolve PMMA resin.

Step ii is generally performed using any lithography technique in common use, such as photolithography or electronic lithography.

Step iv is generally performed by dissolving the resin in a solvent.

This application therefore also relates to components comprising a micro/nano-structured thin layer spin transition material capable of being obtained by the process according to the invention.

DETAILED DESCRIPTION OF THE INVENTION

The following examples are provided by way of representation and without restricting this invention.

1. Example of the Layer-by-Layer Process.

Figure 5A:
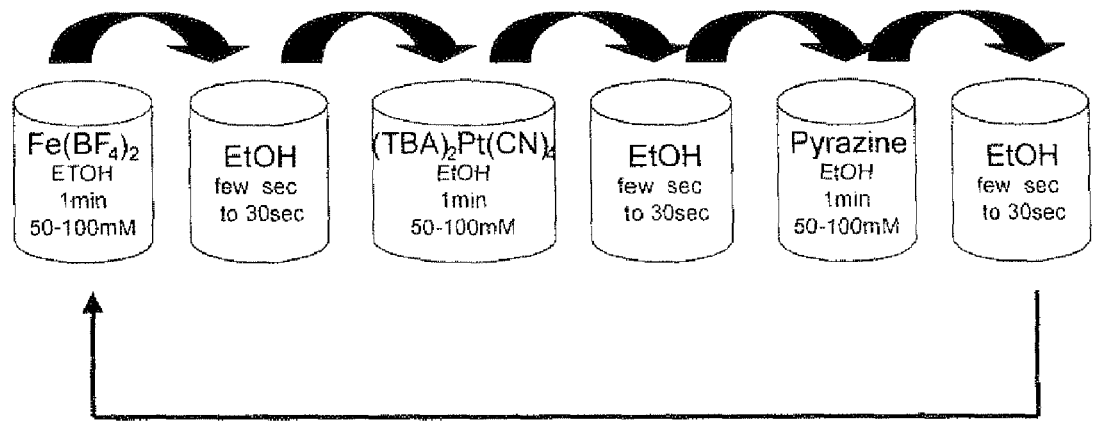
FIGS. 5a, 5b and 5c: Diagrams of the layer-by-layer deposition of the spin transition compound Fe(pz)[Pt(CN)$_4$].
Figure 5B:
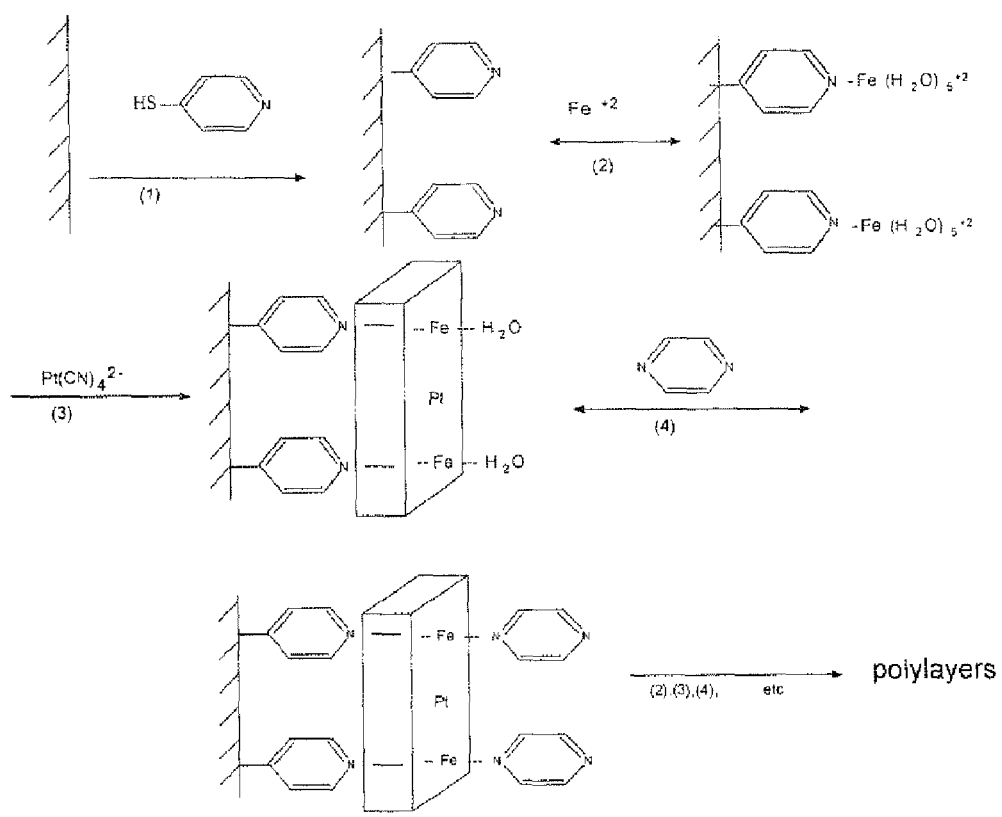
Figure 5C:
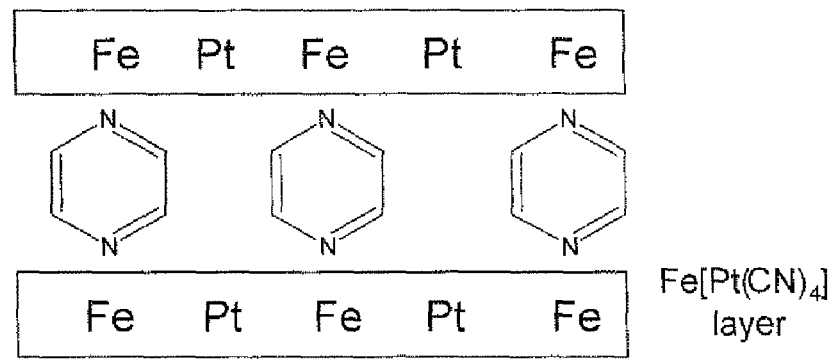

The work of layer-by-layer deposition was carried out as follows. The substrate was based on monocrystalline silicon coated with a layer of titanium (2 nm) and gold (15 nm). It should be noted that this metallised surface substrate may also be replaced by oxidised surface substrates (for example SiO$_2$). The substrate was then coated with a monolayer of cystamine (or other thiols such as 4-mercaptopyridine) by immersing it in a solution of cystamine/ethanol (1-10 mM) overnight. The Fe(pz)[Pt(CN)$_4$] complex was then deposited at −60° C. (CO$_2$/acetone bath) by successively immersing the substrate (coated with the binding layer) in (1) a solution of 50 mM-100 mM of Fe(BF$_4$)$_2$ in ethanol, (2) in a solution of 50 mM-100 mM of (TBA)$_2$[Pt(CN)$_4$] in ethanol and (3) a solution of 50 mM-100 mM of pyrazine in ethanol. The substrate was rinsed in pure ethanol between each step. Successive repetition of these three steps (+rinsings) made it possible to deposit several layers of the complex on the substrate (FIGS. 5a and 5b). At the end of the process the deposit was heated to 150° C. for 30 min to remove traces of solvent.

Figure 6:
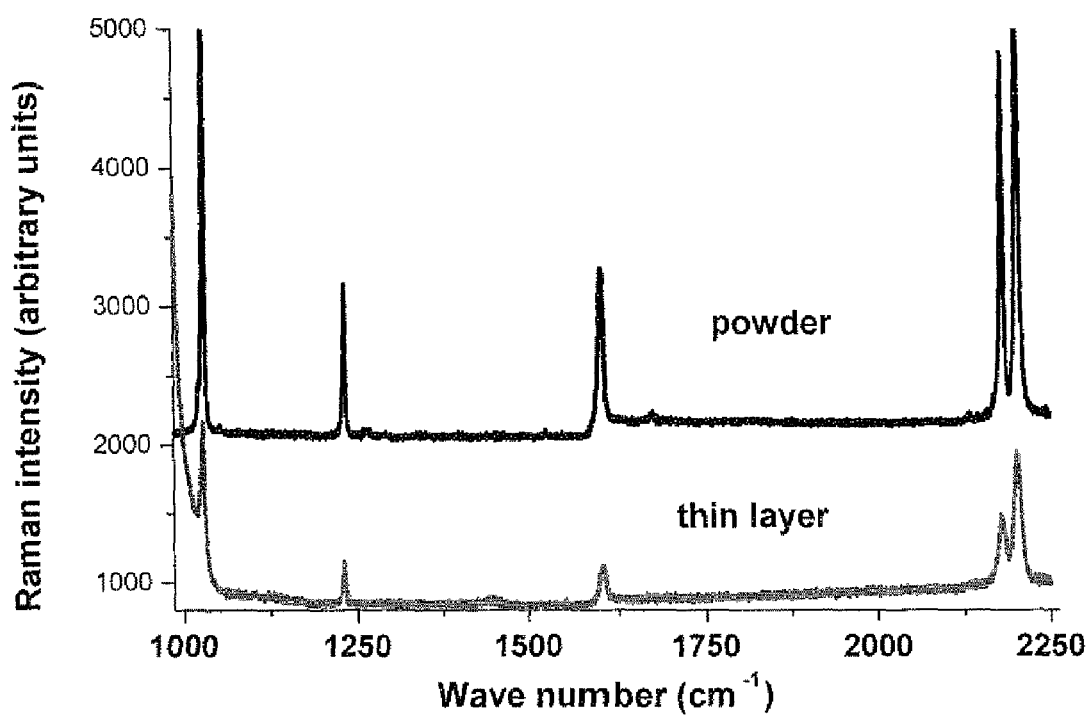
FIG. 6: Raman spectra (recorded at 293 K) of the spin transition compound Fe(pz)[Pt(CN)$_4$] in the massive state (powder) and as a thin layer obtained by layer-by-layer deposition. (The peak at around 1000 cm$^{-1}$ in the spectrum for the thin layer is due to the Raman diffusion of the Si substrate).
Figure 7:
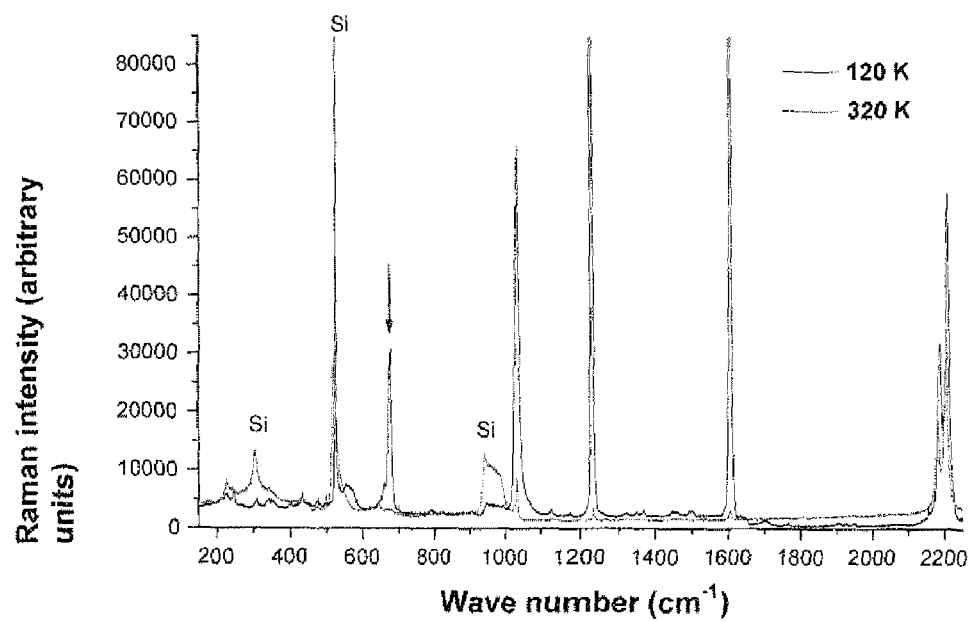
FIG. 7: Raman spectra (recorded at 120 K and 320 K) of the spin transition compound Fe(pz)[Pt(CN)$_4$] as a thin layer obtained by layer-by-layer deposition. One of the characteristic frequencies of the HS or LS spin state is indicated by an arrow.

The Raman spectrum of the deposited product was recorded at 293 K using a LABRAM-HR Raman microspectrometer (exciter: HeNe laser at 632.8 nm, 9 mW) under the same conditions as for the powder. FIG. 6 shows the two spectra in the frequency range 1000-2250 cm$^{-1}$. (At lower frequencies the spectrum of the deposit is drowned in the spectrum of the Si substrate). It will be noted that these two spectra have the same characteristic frequencies for the product.

When the thin layer of Fe(pz)[Pt(CN)$_4$] was cooled a thermochromism phenomenon was observed—the deposit was yellow at ambient temperature and became red at lower temperatures. This phenomenon is a consequence of the thermo-induced spin transition and has already been reported for the massive material by some of the inventors of this application (S. Bonhommeau et al., Angew. Chem. Int., Ed. 44, 2005, 2-5).

Figure 8:
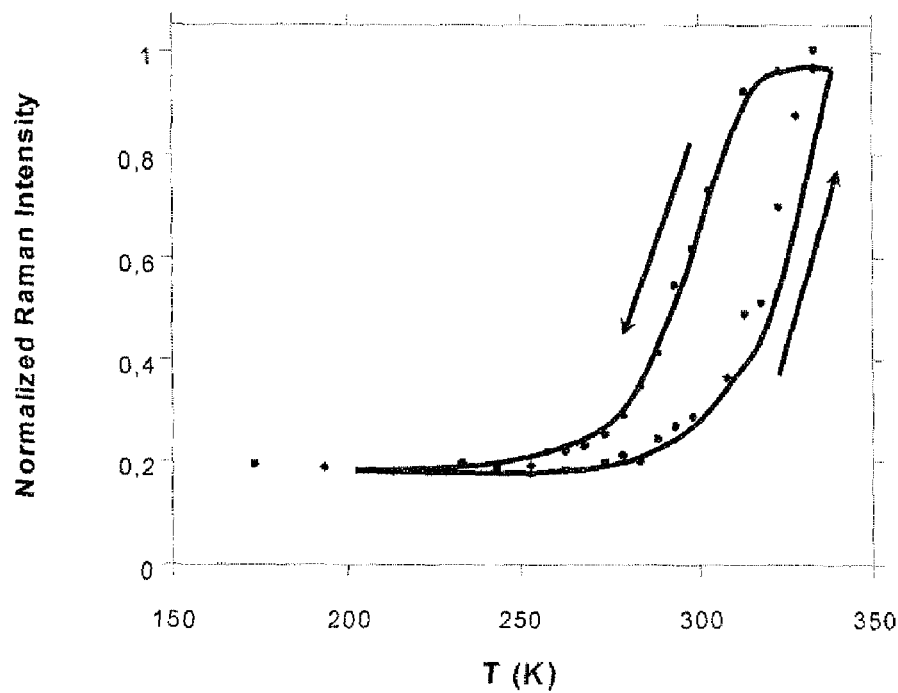
FIG. 8: Hysteresis cycle for the spin transition compound Fe(pz)[Pt(CN)$_4$] as a thin layer obtained by layer-by-layer deposition.

Raman spectra of thin layers of the compound Fe(pz)[Pt(CN)$_4$] have also been recorded as a function of temperature between 80 and 380 K. This temperature investigation clearly showed that spin transition was established in the thin layer. By way of example, FIG. 8 shows two spectra recorded at 120 K and 320 K. These two spectra can be identified as being spectra of the low spin (120 K) and high spin (320 K) forms; all the characteristic vibration modes of the two spin conditions previously reported for the massive product are observed (G. Molnar et al., J. Phys. Chem. B 106, 2002, 9701-9707). In particular the appearance of a very intense mode around 675 cm$^{-1}$ which is characteristic of the low spin state, at low temperature will be noted.

The change in the intensity of this intense mode around 675 cm$^{-1}$ is used as a marker to quantitatively follow spin transition in the thin layer. FIG. 8 shows the (standardised) intensity of this vibration mode as a function of temperature as the thin layer is heated and cooled. This figure shows a hysteresis cycle centred around ambient temperature (295 K), thus demonstrating conservation of the properties of the material in a thin layer for the first time.

2. Example of the Thermal Sublimation Process

The spin transition molecular compound Fe[HB(pz)$_3$]$_2$ was synthesised according to the article by S. Trofimenko (J. Am. Chem. Soc., 1967, 89, 3170).

The powder obtained was then purified using a conventional chemical sublimer and a primary vacuum. The product was identified by its X-ray diffraction image and the spin transition of the massive product was observed by magnetic measurement. This transition proved to be comparable to that observed by F. Grandjean et al. in their article (Inorg. Chem., 1989, 28, 4406).

The thin layer of the Fe[HB(pz)$_3$]$_2$ complex was deposited at 200° C. under secondary vacuum (10$^{-5}$ mbar) using an Edwards Auto306 evaporator. The substrate was a silicon plate coated with a layer of 2 nm of titanium and 15 nm of gold (previously evaporated onto the Si surface). It should be noted that this substrate with a metallised surface can be replaced by non-conducting substrates (for example SiO$_2$).

Figure 1:
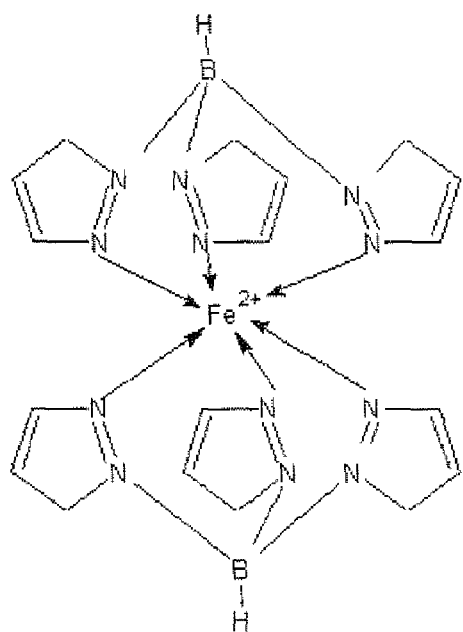
FIG. 1: Structure of the spin transition compound Fe[HB(pz)$_3$]$_2$.
Figure 2:
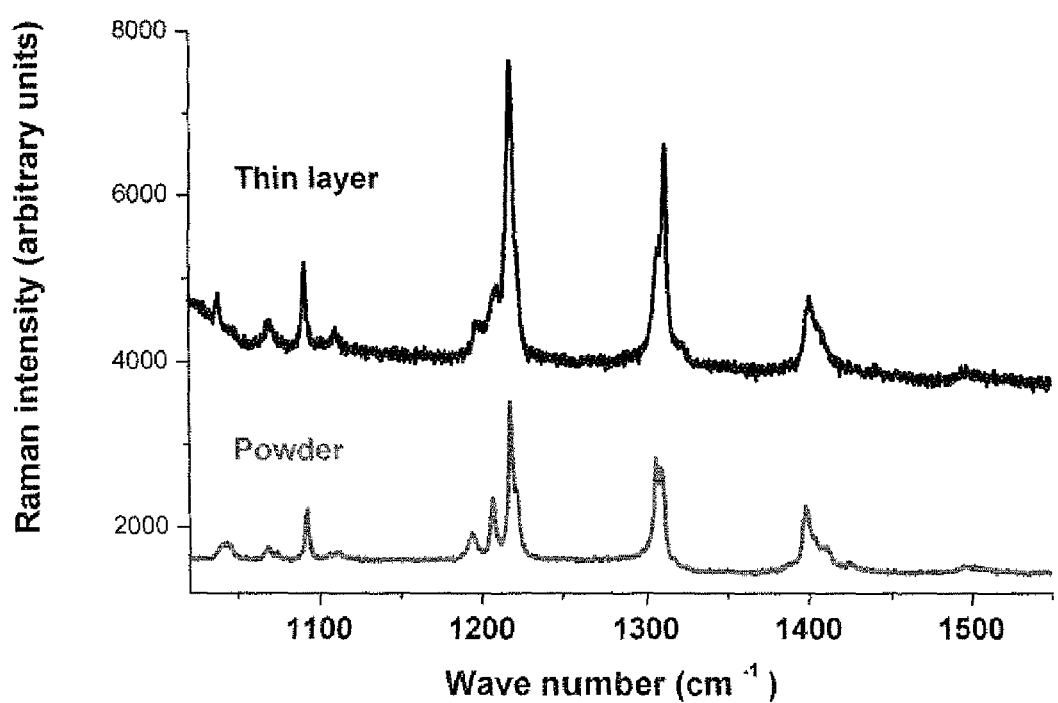
FIG. 2: Raman spectra (recorded at 293 K) of the spin transition compound Fe[HB(pz)$_3$]$_2$ in the massive state (powder) and as a thin layer obtained by thermal evaporation.

The Raman spectrum of the deposited product was recorded at 293 K using a Labram-HR Raman micro-spectrometer (exciter: HeNe laser at 632.8 nm, 9 mW) under the same conditions as for the powder. FIG. 2 shows two spectra in the frequency range 1020-1550 cm$^{-1}$. (At lower frequencies the spectrum of the deposit is drowned in the spectrum of the Si substrate). It will be noted that these two spectra of the thin layer and the massive material are comparable from the point of view of characteristic vibration frequencies.

Figure 3:
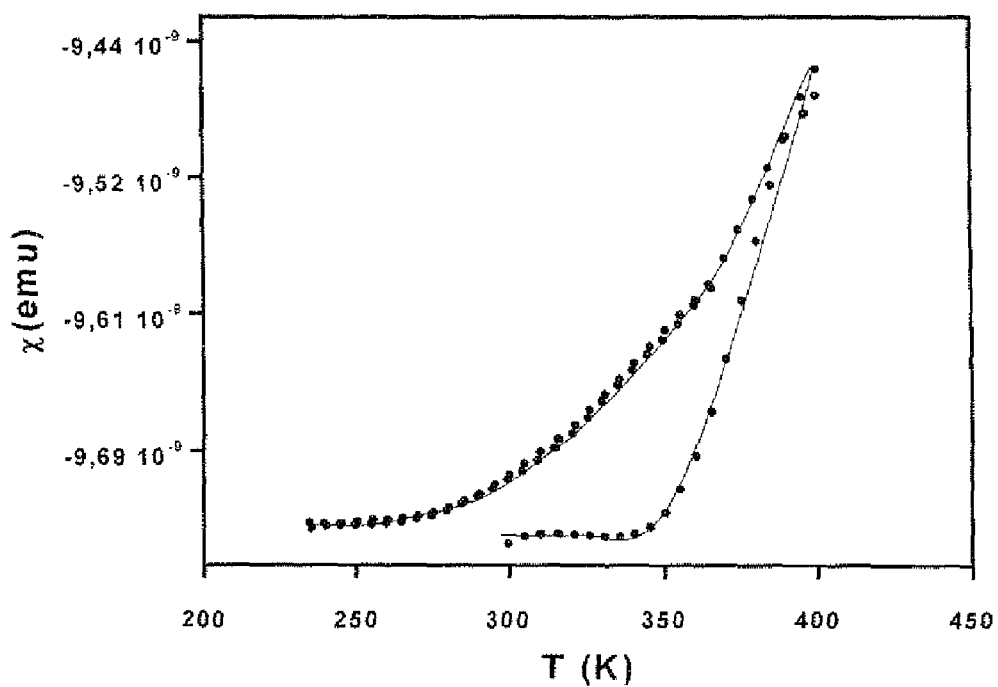
FIG. 3: Thermal hysteresis of the magnetic susceptibility of the compound Fe[HB(pz)$_3$]$_2$ in the form of a thin layer (graph not corrected for the diamagnetic contribution of the substrate).
Figure 4:
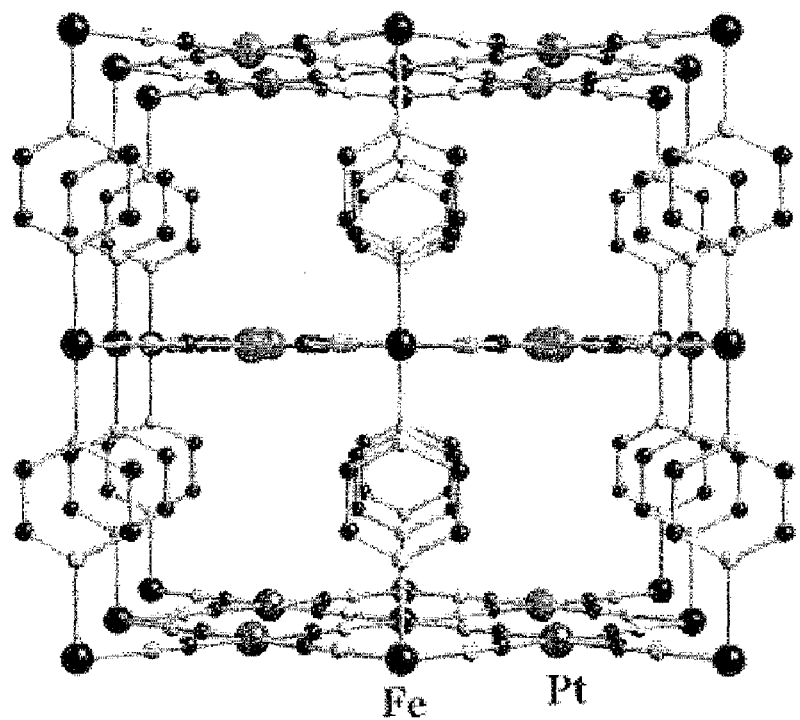
FIG. 4: Structure of the spin transition compound Fe(pz)[Pt(CN)$_4$].

A magnetic measurement was carried out using a MPMS5 magnetometer (Quantum Design) using a magnetic field of 2 T (field parallel to the plane of a substrate). FIG. 3 shows the thermal variation of the magnetic susceptibility of the thin layer of the compound Fe[HB(pz)$_3$]$_2$. Extensive hysteresis around 330 K is observed, thus demonstrating that the properties of the material are preserved in thin layer. Furthermore, as the thin layer was heated/cooled a thermochromism phenomenon was observed—the material was pink at ambient temperature and became progressively colourless at higher temperatures. This phenomenon was also the consequence of thermo-induced spin transition.

3. Example of the Micro- and Nano-Structuring of Thin Layers

Resin patterns were obtained by standard photolithographic methods. The substrate was based on monocrystalline silicon coated with a layer of gold. This substrate having a metallised surface may also be replaced by substrates having an oxidised surface (for example SiO$_2$). The substrate was coated with reversible photosensitive resin (AZ5214E) using spin coating. The patterns were produced in the resin by UV radiation (365 nm) using a mask, through which the patterns may appear recessed or in relief as desired.

Figure 9:
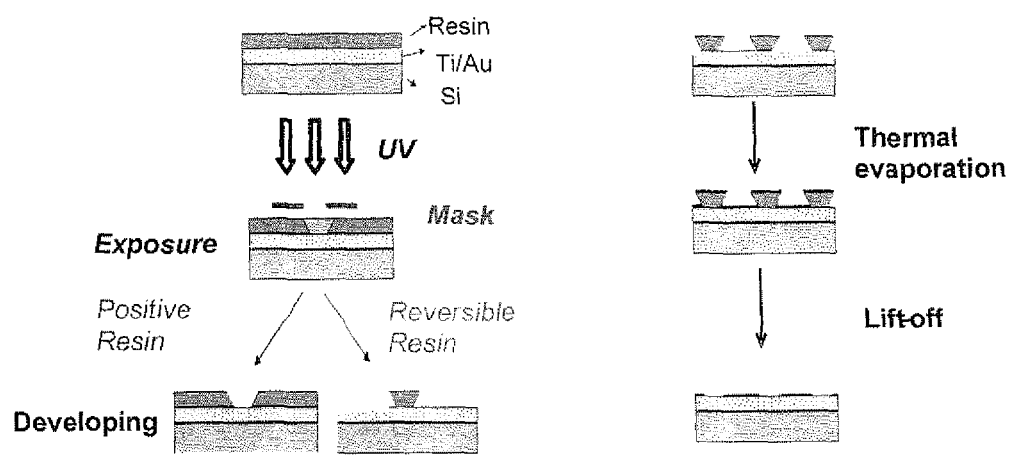
FIG. 9: Diagrammatical presentation of the process for the microstructuring of thin layers of the spin transition complex Fe[HB(pz)$_3$]$_2$ by photolithography and thermal evaporation.
Figure 10:
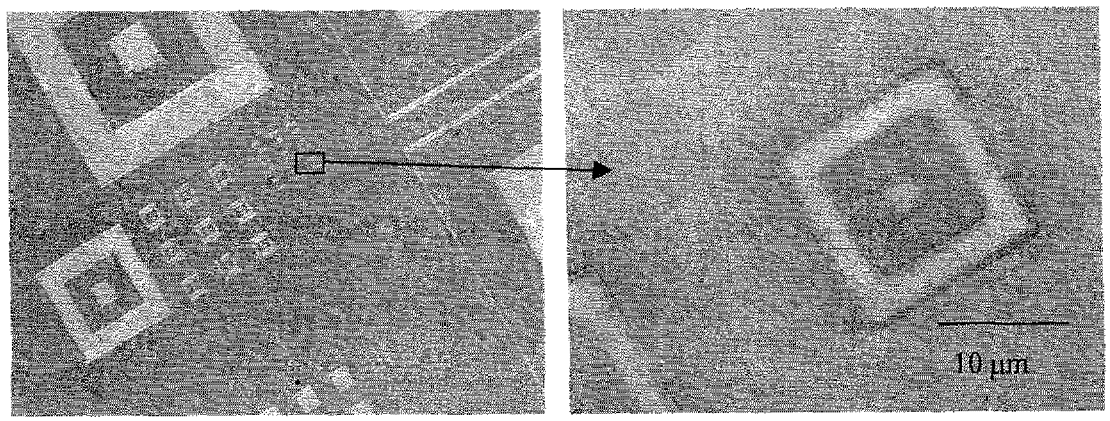
FIG. 10: Photographs of microstructures of the compound Fe[HB(pz)$_3$]$_2$. The metal areas not coated with the product correspond to areas protected by the photolithographic resin.
Figure 11:
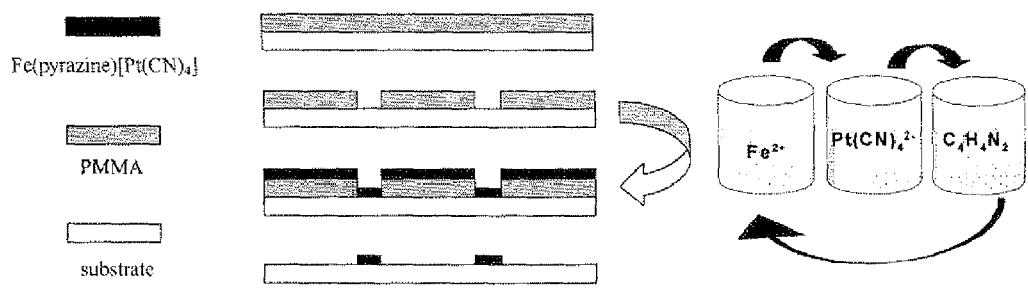
FIG. 11: Diagrammatical presentation of the process for microstructuring thin layers of the spin transition complex Fe(pyrazine)[Pt(CN)$_4$] by electronic lithography and layer-by-layer deposition and lift-off.
Figure 12:
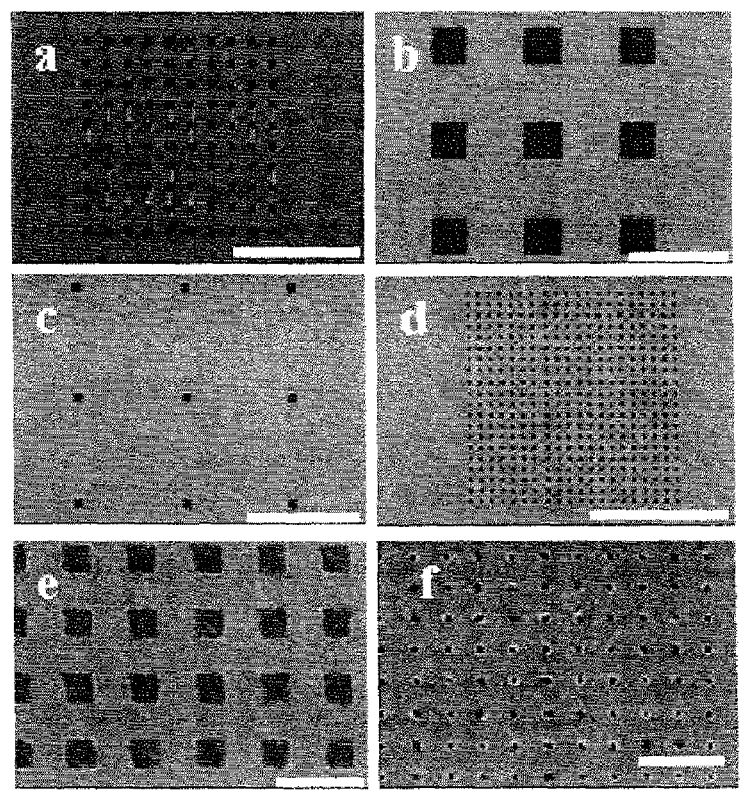
FIG. 12: Images obtained by SEM of a layer according to the invention having different structures obtained following fifteen deposition cycles (a, b: 2 µm; c: 500 nm; d, e: 200 nm; f: 30 nm). The bars on the scale are 30 µm (a), 5 µm (b, c, d) and 500 nm (e, f) respectively.

The Fe[HB(pz)$_3$]$_2$ complex was deposited by the thermal evaporation method described previously. Subsequently the resin patterns were removed by rinsing in acetone (lift-off), leaving a deposit of the product with recessed patterns on the substrate (see the process diagram in FIG. 9). FIG. 10 shows a number of photographs of microstructured thin layers obtained after thermal evaporation of the Fe[HB(pz)$_3$]$_2$ complex.

The effectiveness of this method has therefore been demonstrated for the example of the Fe[HB(pz)$_3$]$_2$ complex. Furthermore, this complex can be replaced by any other complex which is insoluble in the solvent used to lift off the resin and which can be deposited as a thin layer (for example the complexes Fe(pyrazine)[Pt(CN)$_4$], Fe(pyrazine)Ni(CN)$_4$, NaCo[Fe(CN)$_6$], Fe(4-4'-azopyridine)Pt(CN)$_4$, or RbMn[Fe(CN)$_6$]).

Thus the nano/microstructuring process was also carried out using the Fe(pyrazine[Pt(CN)$_4$] complex as follows.

Polished substrates of 4-inch silicon (type p, 10 Ωcm$^{-1}$) were coated with 5 nm of titanium and 15 nm of gold deposited by thermal evaporation at a pressure of 5×10$^{-7}$ using a Veeco 770 thermal evaporator. After being rinsed in a saturated mixture of chromium trioxide in 95% sulphuric acid, a PMMA resin (950.000 mw, 30 g/l in methyl-isobutyl-ketone (MIBK) solvent) approximately 150 nm thick was spread over the surface of the gold at a rate of 3000 rpm for 30 seconds. The resin was heated to 175° C. for 2 minutes and structured by writing with an electron beam at 20 kV with a beam current of 116 pA and a spot width of 10 nm using different doses of radiation between 150 and 300 μCcm$^{-2}$. The exposed resin was developed in a solution of 1:3 MIBC: IPA (isopropanol) at 20° C. for 45 seconds. The sample was immersed in pure IPA for 30 seconds in order to stop the developing process and dried in a flow of nitrogen. After developing the thin layers of Fe(pyrazine[Pt(CN)$_4$] were deposited on the substrate as follows. The substrate was first rendered functional by immersion overnight in a 30 mM solution of 4,4'-azopyridine as described by Launay et al. (Inorg. Chem., 1991, 30, 1033), in ethanol at ambient temperature. The substrate was first cleaned in pure ethanol and then alternately immersed for a total of 15 cycles in solutions of 50 mM Fe(BF$_4$)$_2$.6H$_2$O, 50 mM (tetrabutylammonium)$_2$Pt(CN)$_4$ and 50 mM pyrazine in ethanol for one minute at −60° C. under a nitrogen atmosphere, with a step of rinsing in pure ethanol between each step (for 30 seconds). Finally the materials obtained were dried under a flow of nitrogen. Finally lifting off was carried out by immersing the substrate in hot dichloroethylene (approximately 60° C.) for two minutes, followed by shaking for 5 minutes in an ultrasound bath (at ambient temperature).

The materials obtained were characterised by atomic force microscopy (AFM) using a Nanoscope III (Veeco, Digital Instruments) equipped with an Si tip (Nanoworld Arrow™ NC). The scans were carried out in air at ambient temperature at a frequency of 1 Hz in tapping mode. The SEM images were recorded using a Hitachi S-4800 operating at 1 keV. Raman spectroscopy at various temperatures was carried out in the frequency range 150-2300 $cm^{-1}$ under either ambient conditions or under a hydrogen atmosphere using a cold head of a THMS600 liquid nitrogen cryostat (Linkam). Before the measurements the samples were heated to 150° C. for 30 minutes in a flow of nitrogen in order to remove solvent residues. A Raman LabRAM-HR spectrometer (Jobin Yvon) was used.

The invention claimed is:

1. A process for deposition of a thin layer having a thickness between 1 nm and 10 µm of a spin transition material onto a substrate, comprising:
   applying a bistable thin layer consisting of the spin transition material, the bistable thin layer having the thickness between 1 nm and 10 µm.

2. The process according to claim 1, further comprising:
   a) application of a binding monolayer,
   b) application of one or more layers of the material by at least one immersion of the substrate coated with the binding monolayer in each of solutions S(i) containing constituent (i) respectively of the material, and
   c) stoving/evaporation of a solvent or solvents of said solution.

3. The process according to claim 2, wherein the material of a binding layer comprises thiol, silane, 4,4'-azopyridine groups or a dendrimer structure.

4. The process according to claim 2, wherein step b) comprises a step of rinsing between each immersion in each solution S(i).

5. The process according to claim 2, wherein solutions S(i) comprise the constituent (i) respectively, which may be coordinated, in alcoholic solution, at concentrations between 10 and 500 mM.

6. The process according to claim 2, wherein step b) is repeated as many times (n) as necessary in order to obtain (n) desired layers and/or a desired thickness.

7. The process according to claim 2, wherein step c) is performed at a temperature of between 100° and 200° C.

8. The process according to claim 1, wherein the material takes a form of a three-dimensional lattice.

9. The process according to claim 1, characterised in that the process comprises the step of thermal sublimation of the material under vacuum.

10. The process according to claim 9, wherein the sublimation step is performed at a pressure of between $10^{-5}$-$10^{-6}$ Torr, at a temperature of between 100 and 300° C.

11. The process according to claim 9, wherein the material is Fe[tris(1-pyrazolyl)borate]$_2$.

12. The process according to claim 1, wherein the substrate comprises Si or $SiO_2$ which may be coated with one or more layers of metal.

13. The process according to claim 1, wherein the substrate is micro- or nano-structured.

14. A process of micro/nano-structuring spin transition material in a thin layer on a substrate comprising:
   i. applying a photosensitive resin or a resin for electronic lithography onto a substrate,
   ii. obtaining the desired resin patterns,
   iii. applying a single layer spin transition material, and
   iv. lift-off of the resin.

15. The process according to claim 14, wherein the resin is polymethylmethacrylate.

16. The process according to claim 14, wherein the desired resin patterns are obtained by writing with an electron beam.

17. The process according to claim 14, wherein lift-off is performed by immersing in a solvent dissolving the resin.

* * * * *